(12) United States Patent
Nandakumar et al.

(10) Patent No.: US 8,927,385 B2
(45) Date of Patent: Jan. 6, 2015

(54) ZTCR POLY RESISTOR IN REPLACEMENT GATE FLOW

(71) Applicant: Texas Instruments Incorporated, Dallas, TX (US)

(72) Inventors: Mahalingam Nandakumar, Richardson, TX (US); Deborah J. Riley, Murphy, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/716,424

(22) Filed: Dec. 17, 2012

(65) Prior Publication Data

US 2014/0167182 A1    Jun. 19, 2014

(51) Int. Cl.
*H01L 21/20*    (2006.01)
*H01L 49/02*    (2006.01)
*H01L 29/66*    (2006.01)
*H01L 27/06*    (2006.01)

(52) U.S. Cl.
CPC .......... *H01L 28/20* (2013.01); *H01L 29/66545* (2013.01); *H01L 27/0629* (2013.01)
USPC .................................. 438/382; 257/E21.004

(58) Field of Classification Search
USPC ................. 257/350, 358, 351, 360, 904, 300, 257/E21.048, E21.004, E21.616; 438/382, 438/210, 171, 384, 381
See application file for complete search history.

(56) References Cited

U.S. PATENT DOCUMENTS

| | | | |
|---|---|---|---|
| 2007/0023844 A1* | 2/2007 | Tsukamoto et al. | 257/380 |
| 2007/0096183 A1* | 5/2007 | Ogawa et al. | 257/300 |
| 2009/0236669 A1* | 9/2009 | Chen et al. | 257/380 |
| 2011/0117710 A1* | 5/2011 | Lin et al. | 438/238 |
| 2011/0156161 A1* | 6/2011 | Tseng et al. | 257/379 |
| 2011/0186916 A1* | 8/2011 | Kurz et al. | 257/288 |
| 2011/0266633 A1* | 11/2011 | Beyer et al. | 257/379 |
| 2011/0266637 A1* | 11/2011 | Lee et al. | 257/410 |
| 2012/0108020 A1* | 5/2012 | Baldwin et al. | 438/210 |
| 2012/0139049 A1* | 6/2012 | Kanike | 257/350 |
| 2013/0105912 A1* | 5/2013 | Hsu et al. | 257/379 |

* cited by examiner

*Primary Examiner* — William F Kraig
*Assistant Examiner* — Latanya N Crawford
(74) *Attorney, Agent, or Firm* — Jacqueline J. Garner; Frederick J. Telecky, Jr.

(57) ABSTRACT

An integrated circuit having a replacement gate MOS transistor and a polysilicon resistor may be formed by removing a portion at the top surface of the polysilicon layer in the resistor area. A subsequently formed gate etch hard mask includes a MOS hard mask segment over a MOS sacrificial gate and a resistor hard mask segment over a resistor body. The resistor body is thinner than the MOS sacrificial gate. During the gate replacement process sequence, the MOS hard mask segment is removed, exposing the MOS sacrificial gate while at least a portion of the resistor hard mask segment remains over the resistor body. The MOS sacrificial gate is replaced by a replacement gate while the resistor body is not replaced.

10 Claims, 6 Drawing Sheets

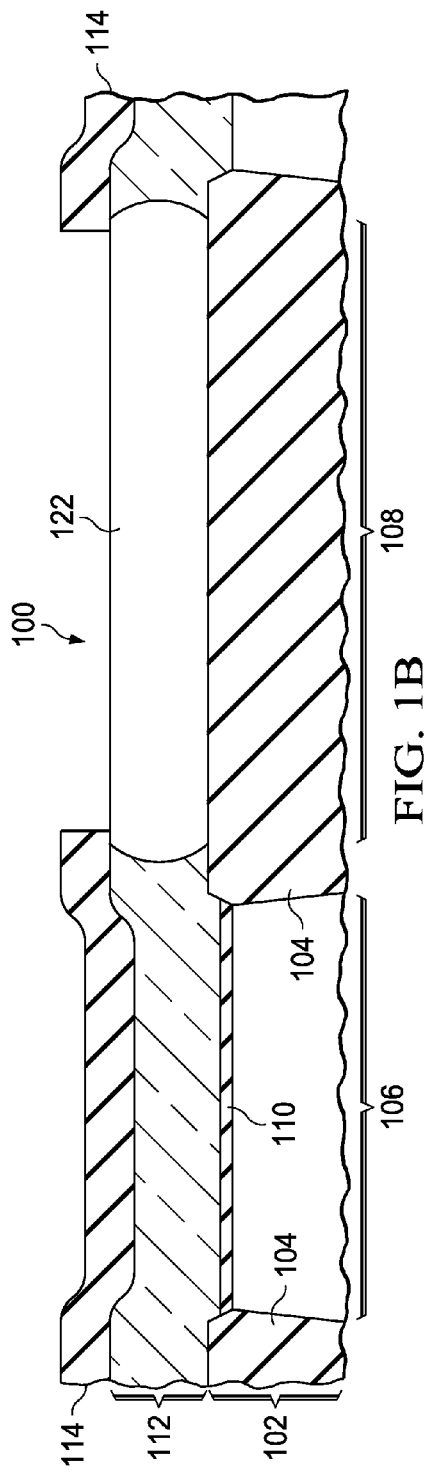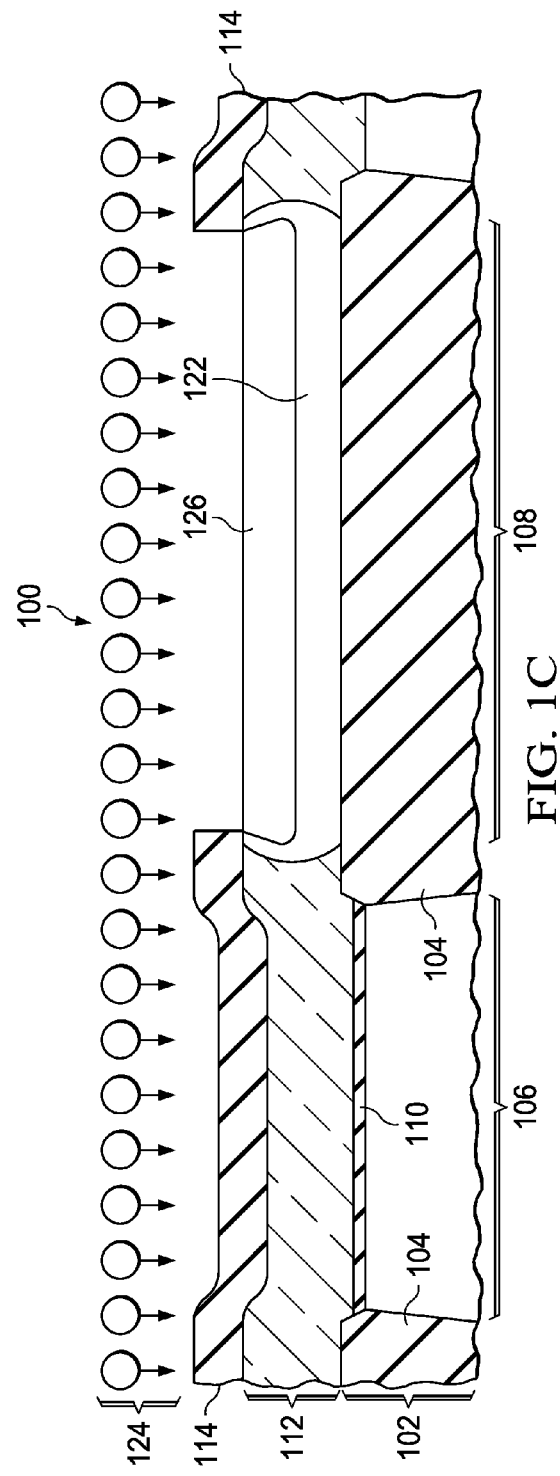

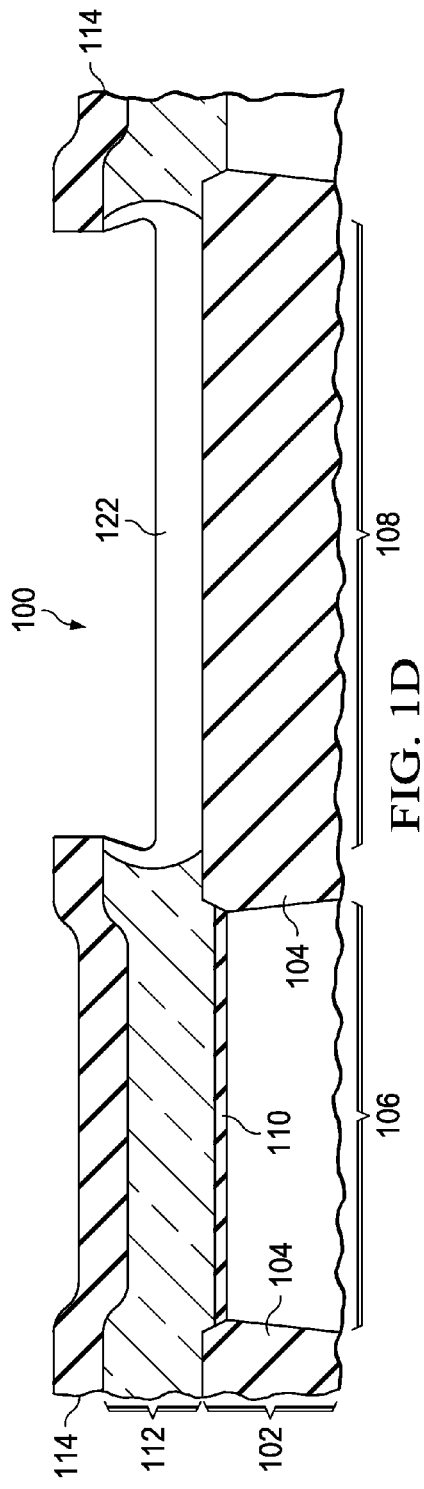
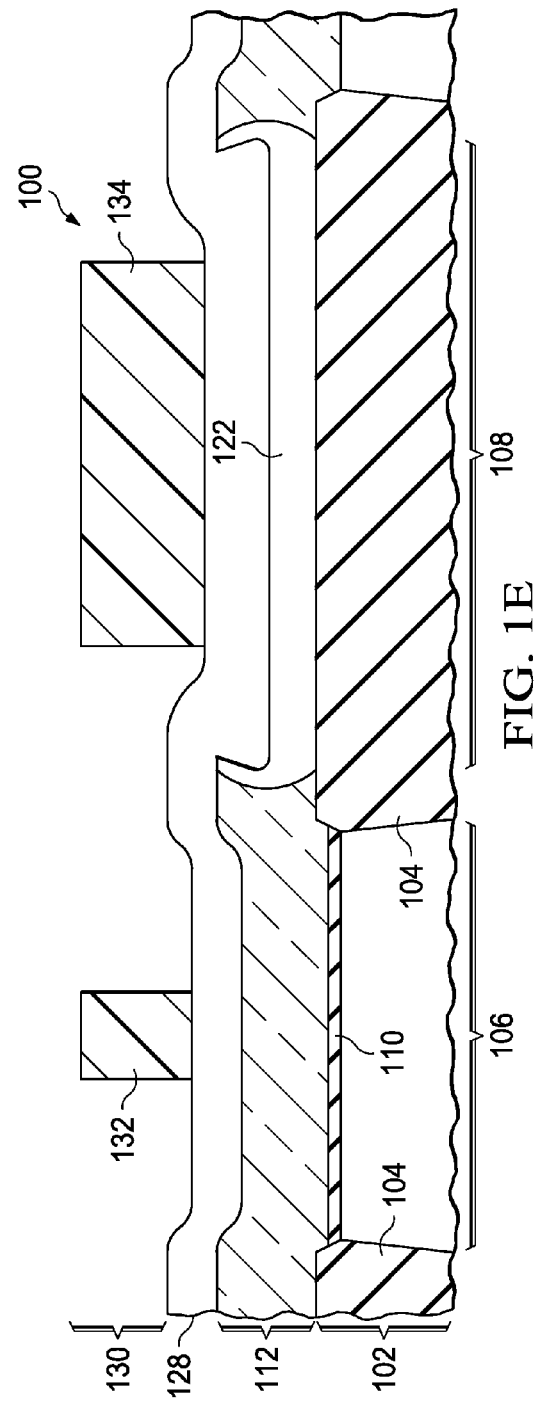
FIG. 1D
FIG. 1E

US 8,927,385 B2

ZTCR POLY RESISTOR IN REPLACEMENT GATE FLOW

FIELD OF THE INVENTION

This invention relates to the field of integrated circuits. More particularly, this invention relates to resistors in integrated circuits.

BACKGROUND OF THE INVENTION

An integrated circuit may be formed by replacing polycrystalline silicon in gates of metal oxide semiconductor (MOS) transistors with metal, a process commonly referred to as replacement gate. It may be desirable to form a resistor of polycrystalline silicon, commonly referred to as polysilicon, in an integrated circuit formed with a replacement gate process. Forming the polysilicon resistor must maintain polysilicon in the resistor area while replacing the polysilicon in the MOS transistor gates. Integrating the polysilicon resistor into the integrated circuit fabrication sequence to provide a desired range of sheet resistance without unduly increasing cost and complexity of the fabrication sequence may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit having a replacement gate MOS transistor and a polysilicon resistor may be formed by removing a portion at the top surface of the polysilicon layer in the resistor area. A subsequently formed gate etch hard mask includes a MOS hard mask segment over a MOS sacrificial gate and a resistor hard mask segment over a resistor body. During the gate replacement process sequence, the MOS hard mask segment is removed, exposing the MOS sacrificial gate while at least a portion of the resistor hard mask segment remains over the resistor body. The MOS sacrificial gate is replaced by a replacement gate while the resistor body is not replaced.

DESCRIPTION OF THE VIEWS OF THE DRAWING

FIG. 1A through FIG. 1J are cross sections of an integrated circuit depicted in successive stages of fabrication.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit having a replacement gate MOS transistor and a polysilicon resistor may be formed by removing a top portion of the polysilicon layer in the resistor area. A subsequently formed gate etch hard mask includes a MOS hard mask segment over a MOS sacrificial gate and a resistor hard mask segment over a resistor body. The resistor body is thinner than the MOS sacrificial gate. During a gate replacement process sequence, the MOS hard mask segment is removed, exposing the MOS sacrificial gate while at least a portion of the resistor hard mask segment remains over the resistor body. The MOS sacrificial gate is replaced by a replacement gate while the resistor body is not replaced.

Figure 1A:
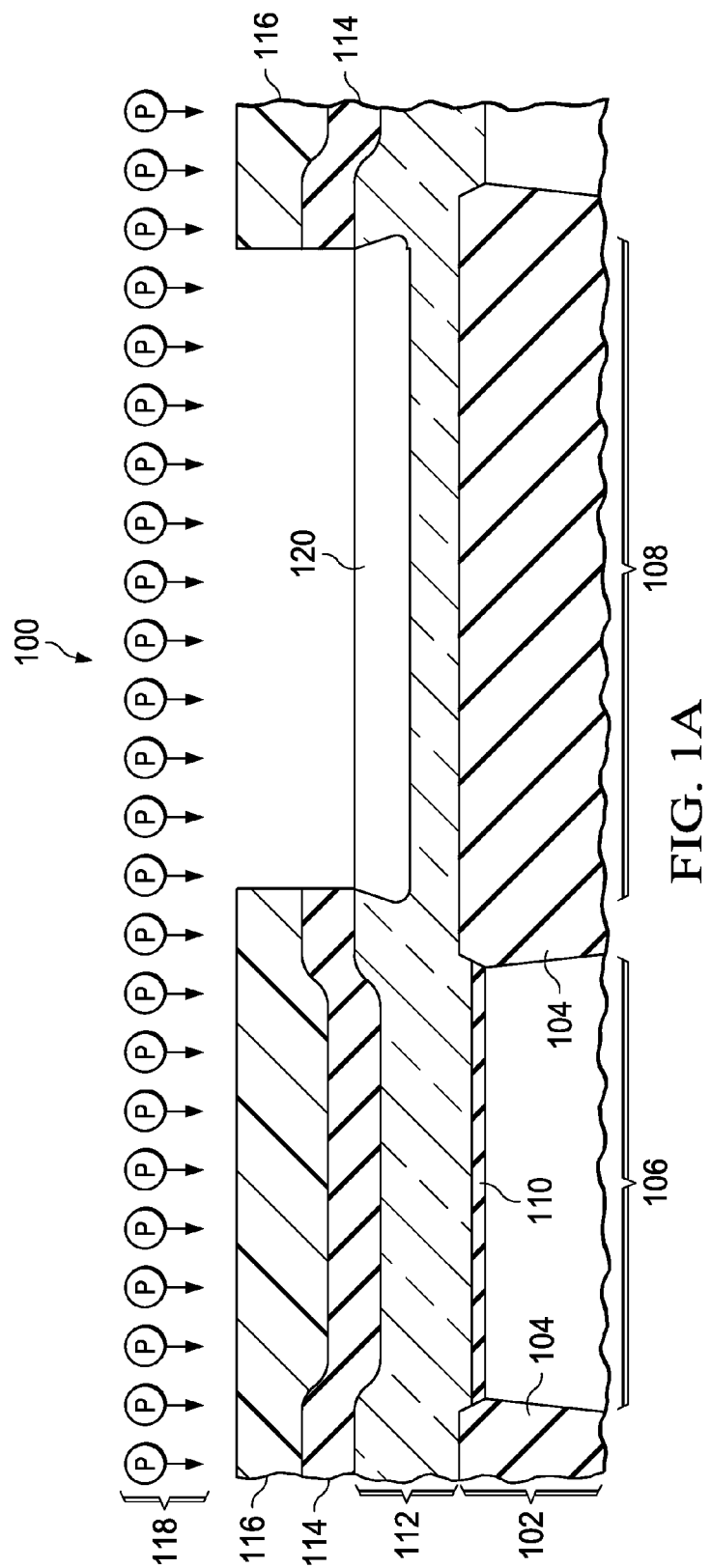

FIG. 1A through FIG. 1J are cross sections of an integrated circuit depicted in successive stages of fabrication. Referring to FIG. 1A, the integrated circuit 100 is formed in and on a semiconductor substrate 102. The substrate 102 may be a single crystal silicon wafer, a silicon-on-insulator (SOI) wafer, a hybrid orientation technology (HOT) wafer with regions of different crystal orientations, or other material appropriate for fabrication of the integrated circuit 100.

Elements of field oxide 104 are formed at a top surface of the substrate 102, for example, of silicon dioxide 200 to 350 nanometers thick, commonly by shallow trench isolation (STI). An STI process may include the steps of: forming an oxide layer on the substrate 102, forming a silicon nitride layer on the oxide layer, patterning the silicon nitride layer so as to expose an area for the field oxide 104, etching a trench in the substrate 102 in the exposed area to an appropriate depth for a desired thickness of the field oxide 104, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer, and removing the silicon nitride layer.

The integrated circuit 100 has a transistor area 106 designated for a MOS transistor, and a resistor area 108 covered by field oxide 104 designated for a polysilicon resistor. A gate dielectric layer 110 is formed at a top surface of the substrate 102 in the transistor area 106. In one version of the instant embodiment, the gate dielectric layer 110 may be a sacrificial layer of silicon oxide which will be replaced later in the process. In an alternate version, the gate dielectric layer 110 may be permanent, and so may be one or more layers of silicon dioxide, silicon oxy-nitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The gate dielectric layer 110 may include nitrogen as a result of exposure to a nitrogen containing plasma or a nitrogen-containing ambient gas at temperatures between 50 C. and 800 C. The gate dielectric layer 110 may be formed by any of a variety of gate dielectric formation processes, for example thermal oxidation, plasma nitridation of an oxide layer, and/or dielectric material deposition by atomic layer deposition (ALD). The gate dielectric layer 110 is, for example, 1 to 4 nanometers thick. A thicker gate dielectric layer 110 may be formed in transistors operating above 2.5 volts.

A layer of polysilicon 112 is formed over the gate dielectric layer 110 and field oxide 104. The polysilicon layer 112 may be amorphized or left polycrystalline, and may be, for example, 20 nanometers to 100 nanometers thick.

A layer of dielectric material for a resistor hard mask 114 is formed over the polysilicon layer 112. The resistor hard mask 114 may be, for example, a layer of silicon oxide 20 nanometers to 60 nanometers thick, or may be one or more layers of silicon oxide, silicon nitride, silicon oxynitride and/or other dielectric material. The resistor hard mask 114 must be capable of sustaining temperatures used to anneal the polysilicon layer 112, for example 900° C. to 1050° C.

A resistor implant mask 116 is formed over the layer of dielectric material for the resistor hard mask 114 which exposes the resistor area 108 and covers the transistor area 106. The resistor implant mask 116 may be, for example, photoresist, 100 nanometers to 300 nanometers thick.

The dielectric material of the resistor hard mask 114 is removed in the resistor area 108 exposed by the resistor implant mask 116. The dielectric material may be removed, for example, by a wet etch using dilute hydrofluoric acid, or possibly with a dry etch by a reactive ion etch (RIE) process using a fluorine-containing plasma. The removal process is performed so as to remove less than 10 percent of the polysilicon layer 112 in the resistor area 108.

A resistor doping implant process may be performed which implants dopants 118 into the polysilicon layer 112 in the resistor area 108 to form a resistor implanted layer 120. The dopants 118 are blocked from the transistor area 106 by the resistor implant mask 116 and the resistor hard mask 114. In a version of the instant embodiment in which a resistor with a low temperature coefficient of resistance is desired, the dopants 118 may be boron with a dose of $1 \times 10^{15}$ cm$^{-2}$ to $1 \times 10^{16}$ cm$^{-2}$, to provide a doping density of $1 \times 10^{20}$ cm$^{-3}$ to $4 \times 10^{20}$ cm$^{-3}$. In another version in which a resistor with a high sheet resistance, for example over 200 ohms/square, is desired, a dose of the dopants 118 may be selected to provide a net doping density less than $10^{18}$ cm$^{-3}$. It will be recognized that other sheet resistance values may be obtained by adjusting the dose of the dopants 118. Providing a net doping density that is p-type may advantageously provide more control of the sheet resistance in the final resistor than an n-type net doping density. The resistor implant mask 116 may be removed after the resistor doping implant process is completed, for example by exposing the integrated circuit 100 to an oxygen containing plasma, followed by a wet cleanup to remove any organic residue. In an alternate version of the instant embodiment, the resistor doping implant process may be skipped, so that the polysilicon resistor may be formed using the doping already present in the polysilicon layer 112.

Referring to FIG. 1B, an anneal operation is performed which heats the polysilicon layer 112 so as to diffuse and activate the dopants 118 in the resistor implanted layer 120 to form a resistor doped region 122 in the resistor area 108. The resistor doped region 122 may possibly extend to a bottom surface of the polysilicon layer 112. The anneal operation may be, for example, a spike anneal at 950° C. for 5 seconds or 1050° C. for 1 second.

Referring to FIG. 1C, an amorphizing implant process is performed which implants amorphizing atoms 124 into the polysilicon layer 112 in the resistor area 108 to form an at least partially amorphous layer 126 at a top surface of the polysilicon layer 112. The at least partially amorphous layer 126 may extend to a depth of 10 percent to 60 percent of a thickness of the polysilicon layer 112. In one version of the instant embodiment, the at least partially amorphous layer 126 may extend to a depth of 30 percent to 50 percent of a thickness of the polysilicon layer 112. The amorphizing atoms 124 may be, for example, p-type dopant atoms such as gallium or indium, n-type dopant atoms such as arsenic or antimony, group IV atoms such as silicon or germanium, or inert gas atoms such as argon or xenon. An implant energy of the amorphizing atoms 124 is selected to provide a desired depth of the least partially amorphous layer 126. A dose of the amorphizing atoms 124 is selected to provide a desired density of lattice vacancies in the at least partially amorphous layer 126, for example at least $10^{22}$ vacancies/cm$^3$. In one example, $3 \times 10^{14}$ cm$^{-2}$ silicon atoms may be implanted at 5 keV to form the amorphous layer 126 10 to 15 nanometers deep. In another example, $8 \times 10^{13}$ cm$^{-2}$ germanium atoms may be implanted at 20 keV to form the amorphous layer 126 15 to 20 nanometers deep. In a further example, $5 \times 10^{13}$ cm$^{-2}$ xenon atoms may be implanted at 20 keV to form the amorphous layer 126 10 to 15 nanometers deep. The amorphizing atoms 124 are blocked from the transistor area 106 by the resistor hard mask 114.

Referring to FIG. 1D, a damage removal etch is performed which removes the at least partially amorphous layer 126 of FIG. 1C and leaves the resistor doped region 122 under the at least partially amorphous layer 126. The resistor hard mask 114 may be left in place during the damage removal etch as depicted in FIG. 1D, or may be removed prior to, or during, the damage removal etch. In one version of the instant embodiment, the damage removal etch may include an aqueous solution of ammonium hydroxide or tetramethyl ammonium hydroxide; aqueous ammonium etchants may provide a desired level of depth control in cases in which the resistor doped region 122 is p-type. In versions of the instant embodiment in which the damage removal etch does include an aqueous solution of ammonium hydroxide or tetramethyl ammonium hydroxide, and the polysilicon layer 112 outside the resistor doped region 122 is n-type or undoped, keeping the resistor hard mask 114 in place during the damage removal etch will prevent attack of the polysilicon layer 112 outside the resistor doped region 122. In another version of the instant embodiment, the damage removal etch may be a dry etch with a plasma containing fluorine, chlorine and/or bromine.

A thickness of the resistor doped region 122 may be 10 nanometers to 100 nanometers. The thickness of the resistor doped region 122 may be 40 percent to 90 percent of a thickness of the polysilicon layer 112 in the transistor area 106. In one version of the instant embodiment, the thickness of the resistor doped region 122 may be 50 percent to 70 percent of a thickness of the polysilicon layer 112 in the transistor area 106. Any remaining portion of the resistor hard mask 114 may be removed after the damage removal etch is completed.

In an alternate version of the instant embodiment, a top portion of the resistor doped region 122 may be removed by another process than that described in reference to FIG. 1A through FIG. 1D. For example, the top portion of the resistor doped region 122 may be removed by a timed etch using a resistor etch mask. Forming the resistor doped region 122 as p-type and removing the top portion of the resistor doped region 122 by the amorphizing implant and the aqueous ammonium solution may desirably provide a tighter control of the thickness of the resistor doped region 122 compared to other methods, such as the timed etch.

Referring to FIG. 1E, a gate etch hard mask layer 128 is formed over the polysilicon layer 112 including the resistor doped region 122. The gate etch hard mask layer 128 may be, for example, one or more layers of silicon nitride, amorphous carbon, silicon oxynitride, silicon carbide nitride and/or silicon oxynitride carbide, 5 nanometers to 15 nanometers thick. A gate etch mask 130 is formed over the gate etch hard mask layer 128, for example of photoresist. The gate etch mask 130 includes a MOS gate segment 132 in the transistor area 106 and a resistor segment 134 in the resistor area 108.

Figure 1F:
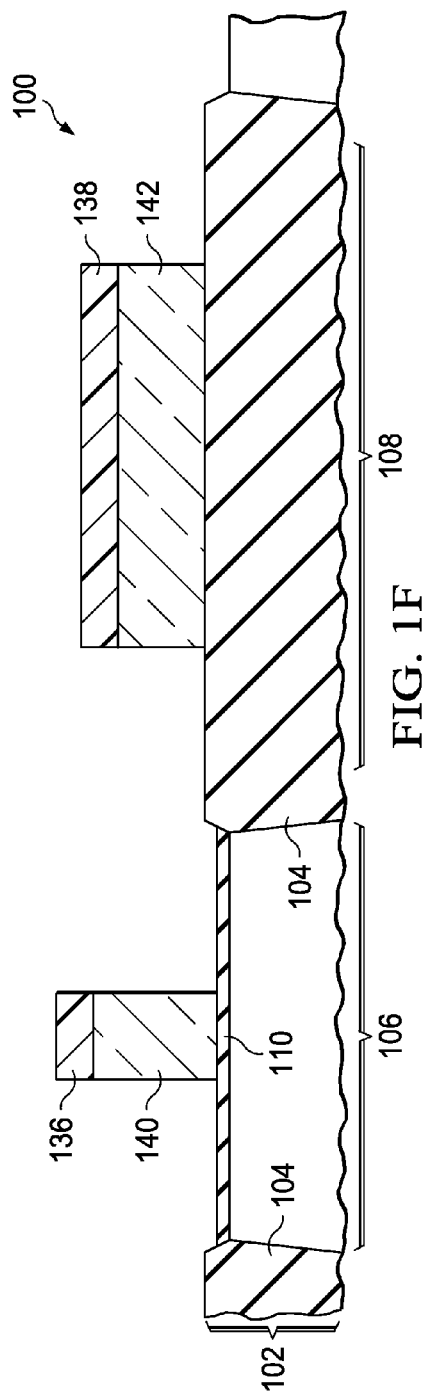

Referring to FIG. 1F, a gate etch process is performed in which a first step removes hard mask material from the gate etch hard mask layer 128 of FIG. 1E outside the gate etch mask 130 of FIG. 1E to form a gate etch hard mask including a MOS hard mask segment 136 under the MOS gate segment 132 of the gate etch mask 130, and a resistor hard mask segment 138 under the resistor segment 134 of the gate etch mask 130. A second step of the gate etch process removes polysilicon from the polysilicon layer 112 of FIG. 1E outside the gate etch hard mask, including a MOS sacrificial gate 140 in the transistor area 106 and a resistor body 142 in the resistor doped region 122 of FIG. 1E. The gate etch mask 130 may be completely removed during the second step of the gate etch process. Hard mask material remains in the resistor hard mask segment 138 after the gate etch process is completed.

Figure 1G:
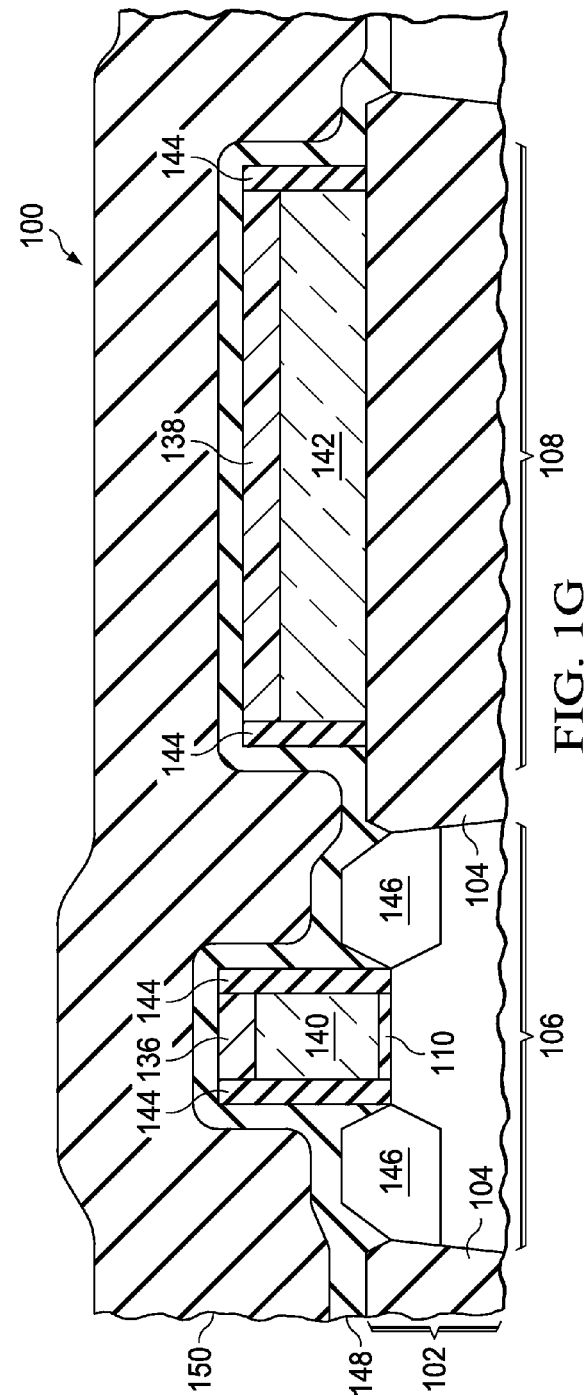

Referring to FIG. 1G, fabrication of the integrated circuit 100 may proceed with forming elements in the transistor area 106. Lightly doped drain (LDD) regions, not shown, may be formed in the substrate 102 adjacent to the MOS sacrificial gate 140. Dielectric gate sidewall spacers 144 may be formed on lateral surfaces of the MOS sacrificial gate 140 and a resistor body 142. Epitaxial source and drain regions 146 may be formed on the substrate 102 adjacent to the MOS sacrificial gate 140.

A pre-metal dielectric (PMD) liner 148 may be formed over an existing top surface of the integrated circuit 100, for example of 5 to 20 nanometers of silicon nitride. A first inter-level dielectric (ILD) layer 150 is formed over an existing top surface of the integrated circuit 100 so as to cover the MOS hard mask segment 136 and the resistor hard mask segment 138. The first ILD layer 150 may be, for example, silicon dioxide formed by chemical vapor deposition (CVD), plasma enhanced chemical vapor deposition (PECVD) using tetraethyl orthosilicate, also known as tetraethoxysilane or TEOS, low pressure chemical vapor deposition (LPCVD), atmospheric pressure chemical vapor deposition (APCVD), high density plasma (HDP), or an ozone based thermal chemical vapor deposition (CVD) process, also known as high aspect ratio process (HARP), a spin-on dielectric such as methylsilsesquioxane (MSQ), or other suitable dielectric layer formation process.

Figure 1H:
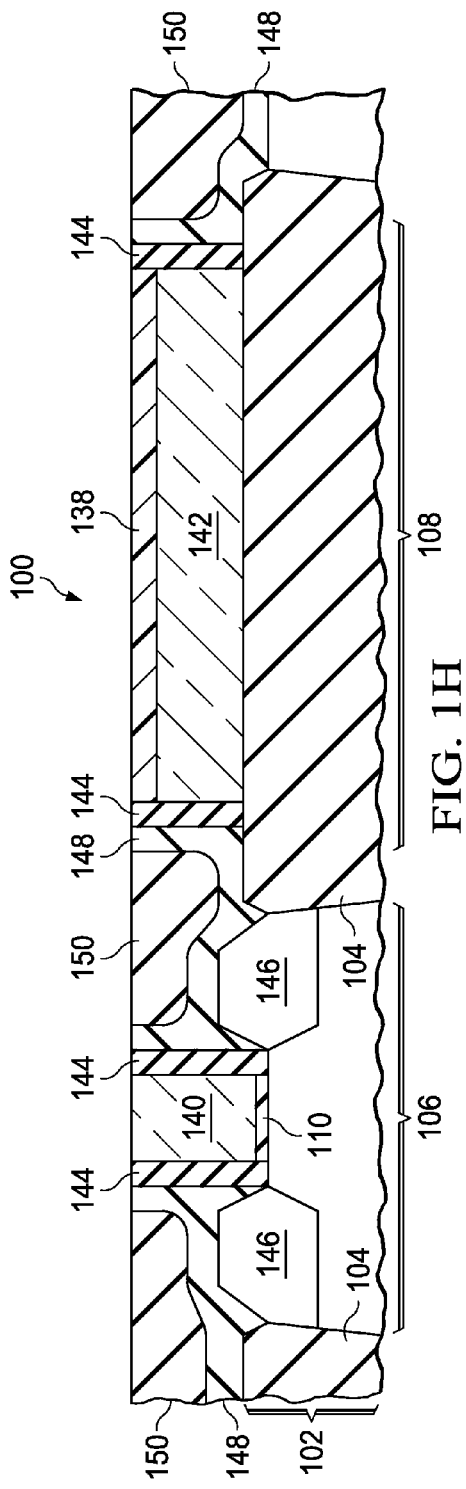

Referring to FIG. 1H, a top portion of the first ILD layer 150 is removed, a top portion of the PMD liner 148 if present is removed, and the MOS hard mask segment 136 is removed, so as to expose a top surface of the MOS sacrificial gate 140. At least a portion of the resistor hard mask segment 138 is left in place, due to the resistor body 142 being thinner than the MOS sacrificial gate 140, so that the resistor body 142 is not exposed. The process of removing the top portion of the first ILD layer 150 and the MOS hard mask segment 136 may be performed, for example, using a chemical-mechanical polish (CMP) process and/or an isotropic plasma etchback process.

Figure 1I:
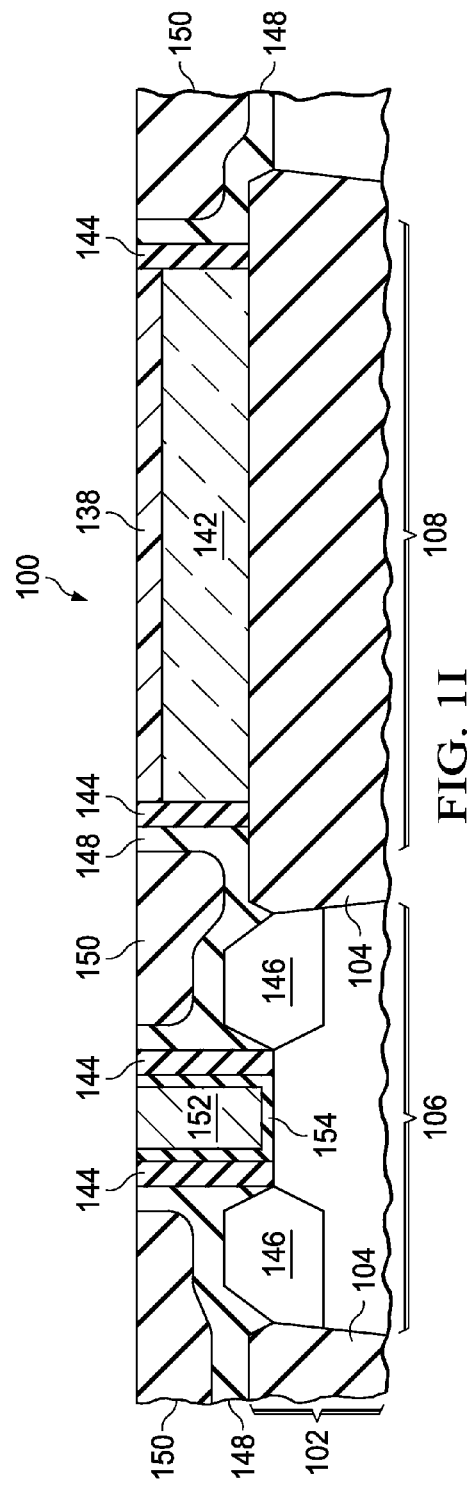

Referring to FIG. 1I, the MOS sacrificial gate 140 of FIG. 1H is replaced by a replacement gate 152. In one version of the instant embodiment, the MOS sacrificial gate 140 and the gate dielectric layer 110 of FIG. 1H are removed by selective etch processes and replaced by a high-k gate dielectric layer 154 and a metal replacement gate 152 as depicted in FIG. 1I. The high-k gate dielectric layer 154 may include, for example, hafnium oxide, hafnium silicate, hafnium silicon oxy-nitride, zirconium oxide, zirconium silicate, zirconium silicon oxy-nitride. The metal replacement gate 152 may include, for example, titanium nitride and/or titanium aluminum nitride. In another version, the MOS sacrificial gate 140 may replaced by a fully silicided (FUSI) replacement gate 152, leaving the gate dielectric layer 110 in place. The resistor body 142 is protected from replacement by the resistor hard mask segment 138. A thickness of the resistor body 142 may be 40 percent to 90 percent of a thickness of the replacement gate 152. In one version of the instant embodiment, the thickness of the resistor body 142 may be 50 percent to 70 percent of a thickness of the replacement gate 152.

Figure 1J:
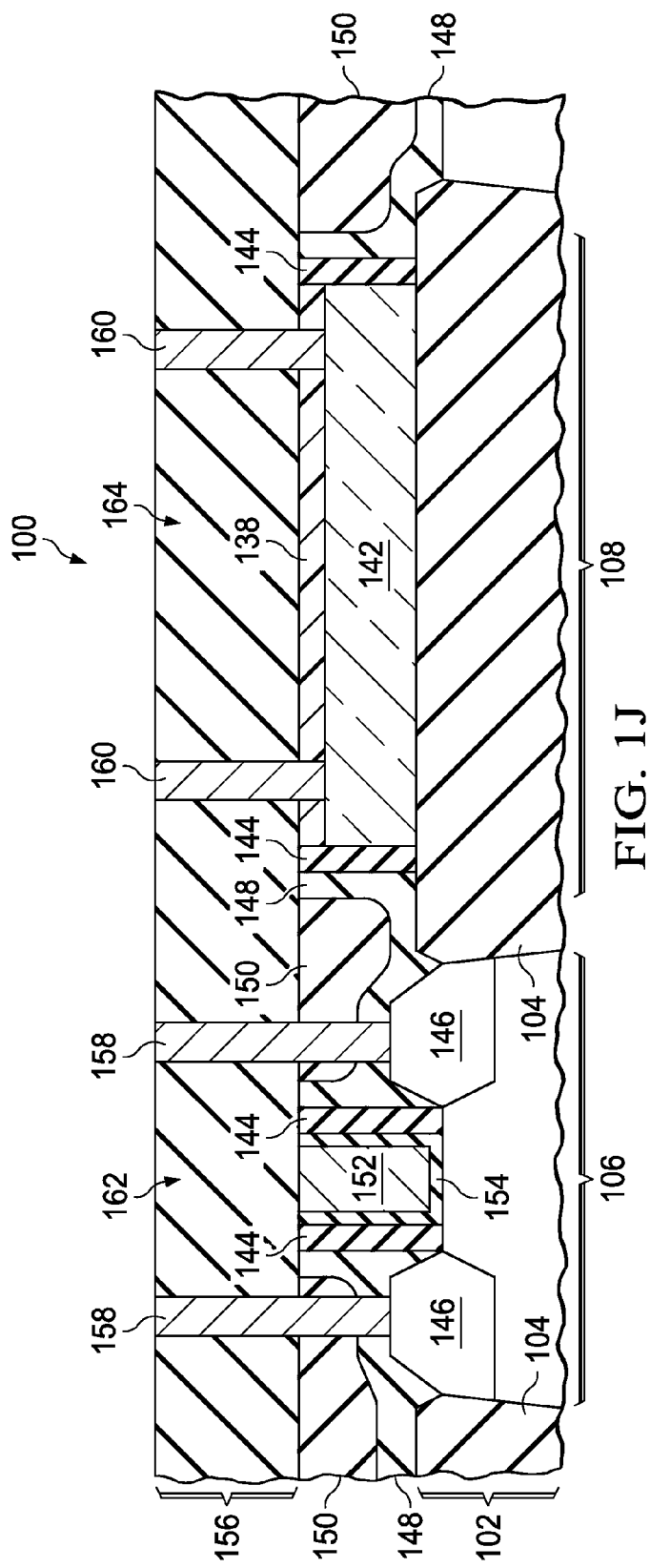

Referring to FIG. 1J, a second ILD layer 156 is formed over an existing top surface of the integrated circuit 100. The second ILD layer 156 may include, for example, one or more layers of silicon oxide, silicon nitride, silicon oxy-nitride, low-k dielectric materials such as organo-silicate glass (OSG), carbon-doped silicon oxides (SiCO or CDO) or dielectric material formed from MSQ. The second ILD layer 156 may possibly include a cap layer, not shown, of silicon carbide, silicon nitride, silicon carbide nitride, silicon oxide carbide, or other suitable cap layer material which may provide a stop layer for a subsequent CMP process.

Transistor contacts 158 are formed through the second ILD layer 156 and the first ILD layer 150 and the PMD layer 148 if present to make electrical connection to the MOS transistor 162. Resistor contacts 160 are formed through the second ILD layer 156 and the resistor hard mask segment 138 to make electrical connection to the resistor body 142. The polysilicon resistor 164 includes the resistor body 142. The transistor contacts 158 and the resistor contacts 160 may be formed in separate operations or may be formed concurrently. In one version of the instant embodiment, in which the epitaxial source and drain regions 146 are present, a total thickness of the second ILD layer 156 and the first ILD layer 150 and the PMD layer 148 over the epitaxial source and drain regions 146 may be close to a total thickness of the second ILD layer 156 and the resistor hard mask segment 138 over the resistor body 142, so that the transistor contacts 158 and the resistor contacts 160 may be formed concurrently without adding to cost or complexity of the fabrication sequence for the integrated circuit 100. The contacts 158 and 160 may be formed, for example, by defining contact areas on a top surface of the second ILD layer 156 with a contact photoresist pattern. Contact holes are formed in the contact areas by removing material from the second ILD layer 156 and the first ILD layer 150, and the PMD layer 148 and the resistor hard mask segment 138, using RIE processes. The contact holes are filled with a first liner metal, such as titanium, a second liner metal such as titanium nitride, and a contact fill metal, such as tungsten. Subsequently, the contact fill metal is removed from the top surface of the second ILD layer 156 using known etching and/or CMP methods. In some versions of the instant embodiment, the transistor contacts 158 or the resistor contacts 160, or both, may be formed in two parts, comprising a lower contact making connection to the MOS transistor 162 or the resistor body 142, and an upper contact making connection to a top surface of the lower contact.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
   providing a substrate comprising a semiconductor;
   forming field oxide at a top surface of said substrate;
   forming a layer of polysilicon over said substrate;
   removing a portion of said polysilicon layer in an area for a polysilicon resistor, so that a thickness of said polysilicon layer in said area for said polysilicon resistor is 40 percent to 90 percent of a thickness of said polysilicon layer in an area for a MOS transistor;
   forming a gate etch hard mask layer over said layer of polysilicon;
   Performing a gate etch process including a first step and a second step, in which:
      said first step removes hard mask material from said gate etch hard mask layer top form a MOS hard mask segment in said area for said MOS transistor and a resistor hard mask segment over said polysilicon layer in said area for said polysilicon resistor; and
      said second step removes polysilicon from said polysilicon layer outside said MOS hard mask segment to form a MOS sacrificial gate and outside said resistor hard mask segment to form a resistor body, so that hard mask material remains in said resistor hard mask segment after said gate etch process is completed;
   removing said MOS hard mask segment from said MOS sacrificial gate while leaving at least a portion of said resistor hard mask segment over said resistor body; and
   replacing said MOS sacrificial gate with a replacement gate so that said resistor body is not replaced, wherein said step of removing said portion of said polysilicon layer in said area for said polysilicon resistor further comprises the steps of:
      forming a layer of dielectric material for a resistor hard mask over said polysilicon layer;
      forming a resistor implant mask over said layer of dielectric material for said resistor hard mask which exposes said area for said polysilicon resistor and covers said area for said MOS transistor;
      removing said dielectric material for said resistor hard mask in said area for said polysilicon resistor exposed by said resistor implant mask;
      implanting dopants into said polysilicon layer in said area for said polysilicon resistor;
      annealing said polysilicon layer so as to diffuse and activate said dopants;
      performing an amorphizing implant process which implants amorphizing atoms into said polysilicon layer in said resistor region to form an at least partially amorphous layer at a top surface of said polysilicon layer, so that said amorphizing atoms are blocked from said area for said MOS transistor by said resistor hard mask; and
      performing a damage removal etch which removes said at least partially amorphous layer and leaves a resistor doped region.

2. The method of claim 1, in which said dopants are boron and are implanted at a dose of $1\times10^{15}$ cm$^{-2}$ to $1\times10^{16}$ cm$^{-2}$.

3. The method of claim 1, in which said damage removal etch is performed with an aqueous solution of ammonium hydroxide.

4. The method of claim 1, in which said damage removal etch is performed with an aqueous solution of tetramethyl ammonium hydroxide.

5. The method of claim 1, in which said amorphizing atoms are selected from the group consisting of gallium, indium, arsenic, antimony, silicon, germanium, argon and xenon.

6. The method of claim 1, in which said amorphizing atoms are implanted with a dose of at least $5\times10^{13}$ cm$^{-2}$.

7. The method of claim 1, in which said resistor hard mask is silicon oxide 20 nanometers to 60 nanometers thick.

8. The method of claim 1, in which a thickness of said resistor body is 10 nanometers to 100 nanometers.

9. The method of claim 1, in which said step of removing said MOS hard mask segment from said MOS sacrificial gate further comprises the steps of:
   forming an inter-level dielectric (ILD) layer so as to cover said MOS hard mask segment and said resistor hard mask segment; and
   removing a top portion of said ILD layer and removing said MOS hard mask segment so as to expose a top surface of said MOS sacrificial gate so that at least a portion of said resistor hard mask segment is left in place, so that said resistor body is not exposed.

10. The method of claim 1, in which said step of replacing said MOS sacrificial gate further comprises the steps of:
    removing a gate dielectric layer under said MOS sacrificial gate;
    forming a high-k gate dielectric layer; and
    forming a metal replacement gate.

* * * * *